June 7, 1966 B. ROSS 3,255,055

SEMICONDUCTOR DEVICE

Filed March 20, 1963 2 Sheets-Sheet 1

BERND ROSS
INVENTOR.

BY [signature]

HIS ATTORNEY

SEMICONDUCTOR DEVICE

Filed March 20, 1963 2 Sheets-Sheet 2

BERND ROSS
INVENTOR.

BY M. Jelin

ATTORNEY

United States Patent Office 3,255,055

Patented June 7, 1966

3,255,055

SEMICONDUCTOR DEVICE

Bernd Ross, Arcadia, Calif., assignor to Hoffman Electronics Corporation, a corporation of California Filed Mar. 20, 1963, Ser. No. 267,387

3 Claims. (Cl. 148—186)

This is a continuation-in-part of application Serial No. 696,665, filed November 15, 1957, now abandoned.

This invention relates to improvements in semiconductor devices and, more particularly, to such devices including P-N junctions in which it is desired to optimize junction performance from the standpoint of reducing voltage and current breakdown of the junction.

If a reverse bias is applied to the P-N junction in a semiconductor, the height of the energy barrier which must be overcome by holes moving from the P material to the N material and conversely by electrons moving from the N material to the P material is increased and current of significant magnitude does not flow until the reverse bias reaches a breakdown voltage sometimes referred to as the Zener voltage. The term "reverse bias" means, of course, that the external source of potential has its positive electrode connected to the contact on the N material and has its negative electrode connected to the contact on the P material. The breakdown or Zener voltage in a semiconductor P-N junction is obtained when the field gradient in junction is sufficiently great to accelerate electrons to energies sufficiently high to produce ionizing collisions with nearby atoms. Departures from perfection within the crystal lattice of the semiconductor material may cause localized high field gradients. Crystal imperfections, including the existence of impurity atoms are most likely at the surface of the crystal and the electrons which are accelerated to produce ionizing collisions and ultimately an avalanche condition may be those tied into loose bonding configurations in the surface states of the semiconductor. It is desirable to reduce the probability of these loosely bonded electrons in the surface states producing the avalanche condition. Thus, the reverse bias breakdown voltage may be maximized.

Therefore, it is an object of this invention to provide a semiconductor with a P-N junction with an improved reverse bias breakdown characteristic.

It is a further object of this invention to provide a rectifying P-N junction in a semiconductor which will have a maximum peak inverse breakdown voltage.

According to the present invention, a breakdown voltage for a given P-N junction is increased and the possibilities of a thermal run-away are decreased by making the angle between the junction and the surfaces of the semiconductor material other than 90°. The voltage gradient over the area of the junction as projected on the surface of the semiconductor is thus minimized for a given applied voltage.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
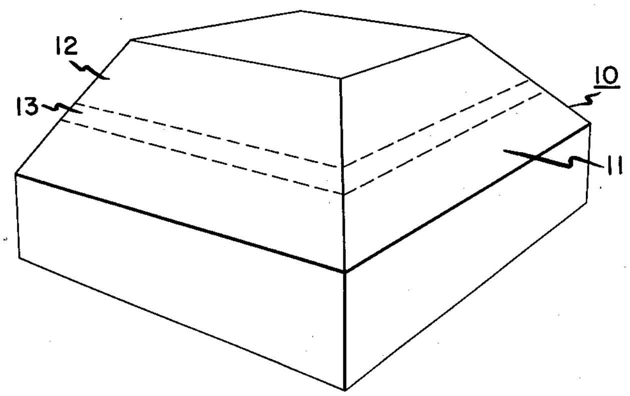
FIGURE 1 is a perspective drawing, much enlarged, of a semi-conductor including a P-N junction and having a configuration according to one possible embodiment of the present invention.

In FIGURE 1, device 10 comprises a wafer of a semiconductor material such as silicon or germanium. It includes a base portion 11 which may, for example, include impurity atoms of the electron donor type thus making this base portion of N-type. Upper portion 12 is of an opposite semiconductor type to lower portion 11 which means, in this example, that upper portion 12 includes impurity atoms of the acceptor type making upper portion 12 a P-type material. The region 13, the width of which is much exaggerated for purposes of clarity in this figure, is the junction region which gives over-all device 10 its unilaterally conductive characteristics. The junction region 13 is the transition region between the material 11 having, for example, an excess of electrons and the region 12 which has, for example, an excess of holes. As is well known, initially, because of the greater number of holes in portion 12 than in portion 11, some holes will drift from region 12 into region 11 leaving an unneutralized negative charge along the side of junction region 13 nearest portion 12. Similarly, initially, some electrons drift into region 12 from region 11 leaving unneutralized positive charges along junction region 13 nearest portion 11. For any further flow of either electrons or holes these charge carriers must overcome the existing barrier field at the junction. Application of a forward potential, that is for the present example applying a positive potential to region 12 and a negative potential to region 11, reduces the effective height of the potential barrier at the junction and significant current may flow if it is reduced sufficiently. On the other hand, if a reverse bias is applied as by making region 12 negative and region 11 positive, the height of the potential barrier in junction 13 increases. The reverse current through junction 13 reaches a limiting maximum referred to as the reverse saturation current until the potential gradient across the junction becomes sufficiently high to cause actual breakdown of the junction and loss of the characteristic unilateral conduction. Experiments of this inventor have shown that it is quite probable that, as a result of departures from crystal perfections at the semiconductor surface and the introduction of impurity atoms in the exposed surfaces of the semiconductor, critical field gradients are first reached at the surface when the reverse bias voltage is increased.

Figure 2:
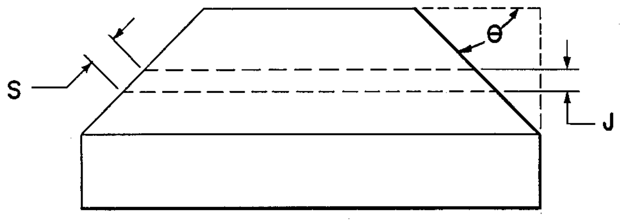
FIGURE 2 is an elevational view of one face of the embodiment of FIGURE 1.

Turning to FIGURE 2, the thickness of the junction region J is usually determined by some desired junction performance characteristic. To decrease the field gradient across the portion of the junction which is at the surface of the semiconductor, the length of the junction where it is intercepted by the surface of the semiconductor should be increased. The desired increase in the length of the junction at the surface of the semiconductor, hence the desired reduction in field gradient for a given applied potential across the semiconductor, may be accomplished by making the angle of intersection between the average plane of the junction and the edges or surfaces of the semiconductor other than the conventional 90°, as shown in FIGURE 2. If the surfaces of portions 11 and 12 of device 10 in the region of junction 13 are shaped by means of lapping or sandblasting, followed by a clean-up etching step, so that the angle $\theta$ in FIGURE 2 is less than 90°, the length of the junction region at the surface is given by the equation $$S=\frac{J}{\sin \theta}$$

For a given potential applied between portions 11 and 12 of device 10, the potential gradient $E_S$ across the surface S as produced by this invention is equal to $E_J \sin \theta$, where $E_J$ is the potential gradient across the junction in the conventional case. In our case $\theta$ is less than 90° so sin $\theta$ is less than 1 and the field gradient across the junction at the peripheral surface of the semiconductor has been reduced. Correspondingly, the reverse breakdown voltage has been increased by this technique.

It is desirable that the variation in the impurity concentration defining the P-N junction as a function of distance along the surface be as gradual as possible. Thus, the advantages become greater as the base angle $\theta$ decreases and the surface intercept S becomes larger.

Figure 3:
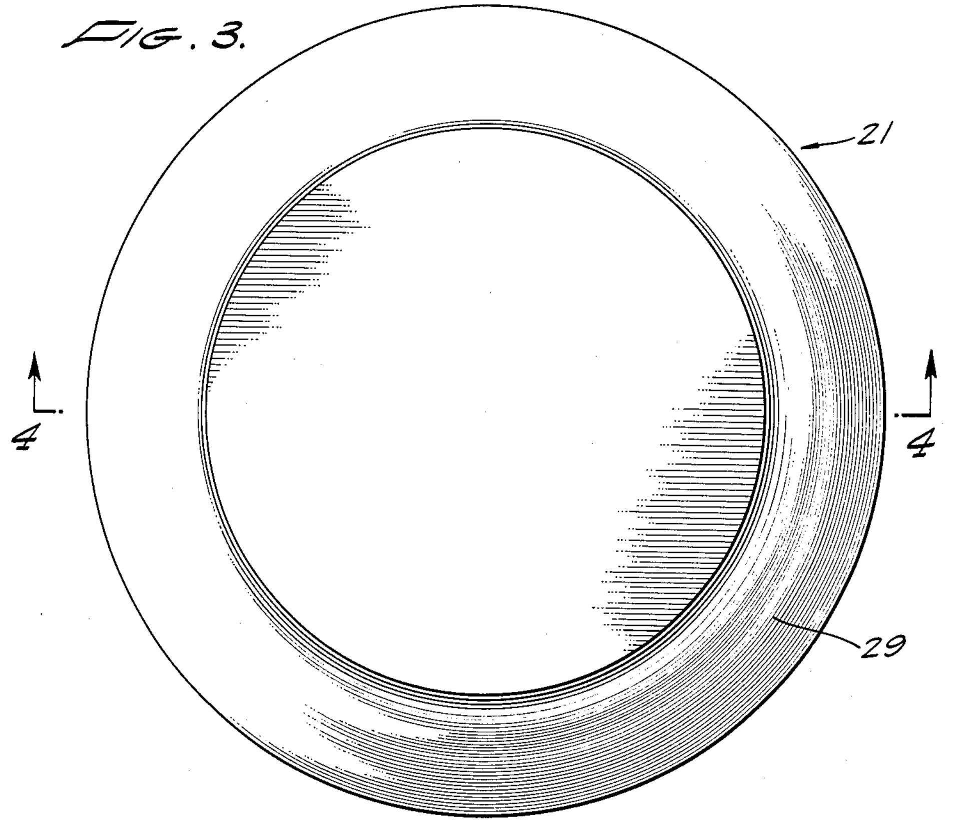
FIGURE 3 is a plan view of a semiconductor device having a configuration according to a different embodiment of the present invention.
Figure 4:
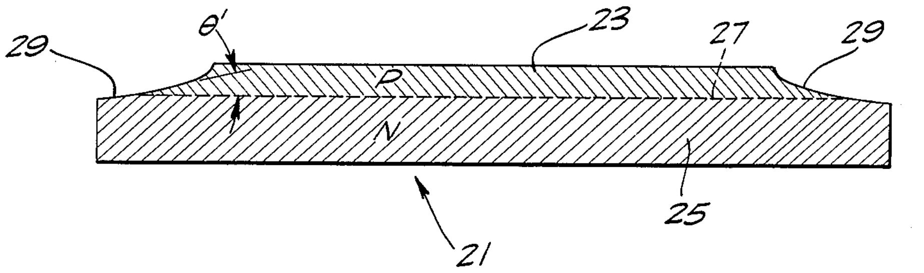
FIGURE 4 is a sectional view taken along line 4—4 of FIGURE 3.

FIGURE 3 shows a semiconductor device 21 which is similar to device 10, except that device 21 is circular in configuration and has a base angle $\theta'$ which is substantially less than 45°, as shown in FIGURE 4. Upper P-type region 23 is separated from lower N-type region 25 by P-N junction 27, which has been shown as a single line for convenience, and which extends to the surface of semiconductor device 21 along surface 29. Where base angle $\theta'$ represents the angle of intersection between surface 29 and the average plane of P-N junction 27, the benefits of the present invention become greater as $\theta'$ becomes smaller. Thus, when the angle is 45°, the potential gradient $E_S$ across the surface S is equal to $.707E_J$, and when the angle is 1°, $E_S=.017E_J$. It has been found that unless $\theta'$ is kept at substantially 30° or less, the benefits derived from the present invention are not significant.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. An asymmetric semiconductor device of the type having a P-N junction therein for permitting current flow when a forward voltage is applied across it and preventing current flow when a reverse voltage is applied across it comprising a wafer of semiconductor material having a first region of one conductivity type, a second region of an opposite conductivity type, said P-N junction being between said first and second regions, said P-N junction extending to and being intercepted by the peripheral surface of said wafer, the entirety of the peripheral surface of the wafer containing the surface-junction intercept intercepting the plane of the junction at an angle substantially less than 90° so that the voltage gradient across the junction at the surface-junction intercept is substantially reduced for a given amplitude of reverse voltage applied across the device.

2. The device of claim 1 wherein said angle is less than 30°.

3. The process for producing a P-N junction semiconductor device with improved peak-inverse voltage characteristics comprising diffusing impurity atoms of a first conductivity type into a wafer of semiconductor material of the opposite conductivity type to form a P-N junction extending to and intercepting the peripheral surface of said wafer and lapping the entirety of the peripheral surface of the wafer containing the surface-junction intercept until it intersects the plane of the junction at an angle substantially less than 90°.

References Cited by the Examiner

UNITED STATES PATENTS

| | | | |
|---|---|---|---|
| 2,794,846 | 6/1957 | Fuller | 148—15 X |
| 2,846,340 | 8/1958 | Jenny | 148—15 |
| 2,929,859 | 3/1960 | Loferski | 136—89 |
| 2,983,633 | 5/1961 | De Bernardi et al. | 148—189 X |

DAVID L. RECK, *Primary Examiner.*

D. L. REISDORF, O. MARJAMA, N. C. LOVELL, *Assistant Examiners.*